(12) United States Patent
Wang

(10) Patent No.: US 10,564,496 B2
(45) Date of Patent: Feb. 18, 2020

(54) ARRAY SUBSTRATE AND MANUFACTURING METHOD THEREOF AND DISPLAY DEVICE

(71) Applicant: BOE TECHNOLOGY GROUP CO., LTD., Beijing (CN)

(72) Inventor: Dongfang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 109 days.

(21) Appl. No.: 15/219,647

(22) Filed: Jul. 26, 2016

(65) Prior Publication Data
US 2017/0261823 A1    Sep. 14, 2017

(30) Foreign Application Priority Data

Mar. 10, 2016   (CN) .......................... 2016 1 0136521

(51) Int. Cl.
*G02F 1/365* (2006.01)
*G02F 1/1362* (2006.01)
(Continued)

(52) U.S. Cl.
CPC ...... *G02F 1/136209* (2013.01); *G02F 1/1368* (2013.01); *H01L 27/1248* (2013.01);
(Continued)

(58) Field of Classification Search
CPC ......... G02F 1/133555; G02F 1/133509; G02F 1/133512; G02F 1/136227; G02F 1/1368;
(Continued)

(56) References Cited

U.S. PATENT DOCUMENTS 6,727,965 B1 *   4/2004   Kubota ................. G02B 5/201
                                                    349/106
9,874,796 B2     1/2018   Ye
(Continued)

FOREIGN PATENT DOCUMENTS

CN         1319195 A      10/2001
CN       105116651 A      12/2015

OTHER PUBLICATIONS

Office Action dated Aug. 14, 2018 issued in corresponding Chinese Application No. 201610136521.9.
(Continued)

*Primary Examiner* — Tucker J Wright
*Assistant Examiner* — Scott Stowe
(74) *Attorney, Agent, or Firm* — Nath, Goldberg & Meyer; Joshua B. Goldberg; Daniel J. Bissing

(57) ABSTRACT

The present application provides an array substrate, which is divided into a plurality of pixel units, wherein each pixel unit is provided therein with a light filtering structure, the light filtering structure includes a first light shielding part and a second light shielding part, the second light shielding part includes a second light shielding part body and a light transmitting hole penetrating through the second light shielding part body, a light transmitting gap exists between a inner boundary of an orthographic projection of the second light shielding part body on a layer in which the first light shielding part is provided and a boundary of the first light shielding part, a transparent light transmitting space is formed above the first light shielding part, and the light transmitting gap allows light with a predetermined wavelength to transmit therethrough.

18 Claims, 4 Drawing Sheets

(51) Int. Cl.
*G02F 1/1368* (2006.01)
*H01L 27/12* (2006.01)

(52) U.S. Cl.
CPC .... *H01L 27/1262* (2013.01); *G02F 1/136227* (2013.01); *G02F 2001/136222* (2013.01); *G02F 2001/136231* (2013.01); *G02F 2203/01* (2013.01); *G02F 2203/05* (2013.01); *G02F 2203/15* (2013.01)

(58) Field of Classification Search
CPC ............. G02F 1/136209; H01L 27/124; H01L 27/3248; H01L 27/14623; H01L 27/3272; H01L 27/1248; H01L 27/1262
See application file for complete search history.

(56) References Cited

U.S. PATENT DOCUMENTS

| 2003/0137622 | A1 | 7/2003 | Song |
| 2008/0094554 | A1 | 4/2008 | Sato et al. |

OTHER PUBLICATIONS

The Second Office Action dated Jan. 11, 2019 corresponding to Chinese application No. 201610136521.9.

\* cited by examiner

ARRAY SUBSTRATE AND MANUFACTURING METHOD THEREOF AND DISPLAY DEVICE

FIELD

The present application relates to the field of display technology, and particularly to an array substrate, a manufacturing method of the array substrate and a display device comprising the array substrate.

BACKGROUND

As for most of display panels (for example, liquid crystal display panels), color filter substrate is required to achieve color display. Most of the color filter substrates are realized by providing a light filtering layer including color filters on the base substrate, which may decrease the brightness of the display panels.

Therefore, how to realize color display without affecting the brightness of the display panel becomes a technical problem to be solved urgently in the art.

SUMMARY

An object of the present invention is to provide an array substrate, a manufacturing method of the array substrate and a display device comprising the array substrate, wherein the display device comprising the array substrate can realize color display without decreasing the brightness.

In order to realize the above object, as one aspect of the present invention, there is provided an array substrate, which is divided into a plurality of pixel units, wherein each pixel unit is provided therein with a light filtering structure, the light filtering structure includes a first light shielding part and a second light shielding part, which are provided in a thickness direction of the array substrate and spaced apart, the first light shielding part is provided below the second light shielding part, the second light shielding part includes a second light shielding part body and a light transmitting hole penetrating through the second light shielding part body along a thickness direction thereof, the first light shielding part is provided below the light transmitting hole, a light transmitting gap exists between an inner boundary of an orthographic projection of the second light shielding part body on a layer in which the first light shielding part is provided and a boundary of the first light shielding part, a transparent light transmitting space is formed above the first light shielding part, and the light transmitting gap allows light with a predetermined wavelength to transmit therethrough.

Preferably, the array substrate is divided into a plurality of pixel unit groups, each of which includes three pixel units, light transmitting gaps of the three pixel units of each pixel unit group are arranged so that lights transmitting through the light transmitting gaps are red light, green light and blue light, respectively.

Preferably, the light filtering structure includes a transparent light filtering layer formed with a light filtering groove, the first light shielding part is provided in the light filtering groove and at bottom thereof, the second light shielding part body is provided on an upper surface of the transparent light filtering layer, and at least one portion of the light transmitting space is provided in the light filtering groove.

Preferably, the pixel unit is provided therein with a thin film transistor, the second light shielding part body and a source and a drain of the thin film transistor are provided in a same layer and are made of a same material.

Preferably, a portion of the second light shielding part body is integrated with the drain of the thin film transistor.

Preferably, the thin film transistor is of a bottom-gate structure, an active layer of the thin film transistor is made of an oxide material, and the transparent light filtering layer is provided between the active layer of the thin film transistor and a layer in which the source is provided.

Preferably, the transparent light filtering layer is made of silicon oxide and/or aluminium oxide.

Preferably, the array substrate further comprises a passivation layer and pixel electrodes, the passivation layer is provided above the layer in which the source and the drain are provided, and each pixel electrode is provided above the passivation layer and electrically connected with a corresponding drain via a through hole.

Preferably, the array substrate further comprises a planarization layer, which is provided above the passivation layer, the pixel electrodes are provided on the planarization layer, and the through hole connecting the pixel electrode and the corresponding drain penetrates through the planarization layer and the passivation layer.

Preferably, the transparent light filtering layer has a thickness ranging from 40 nm to 120 nm.

Preferably, the first light shielding part is made of a metal material.

As another aspect of the present invention, there is provided a manufacturing method of above array substrate, the manufacturing method comprises steps of:

providing a base substrate, wherein the base substrate is divided into a plurality of pixel units;

forming a pattern including a plurality of first light shielding parts on the base substrate; and forming a pattern including a plurality of second light shielding parts.

Preferably, the step of providing the base substrate comprises steps of: providing a transparent base;

forming a transparent light filtering material layer above the transparent base;

forming a plurality of light filtering grooves from the transparent light filtering material layer to obtain the transparent light filtering layer, wherein the first light shielding part is provided in a corresponding light filtering groove and at bottom thereof, and the second light shielding part body is provided on an upper surface of the transparent light filtering layer.

Preferably, the step of providing the base substrate further comprises the following steps performed prior to the step of forming the transparent light filtering material layer above the transparent base:

forming a pattern including a plurality of gates on the transparent base;

forming a gate insulation layer above the pattern including the plurality of gates; and forming a pattern including a plurality of active layers on the gate insulation layer;

the step of providing the base substrate further comprises the following steps performed after the step of forming the transparent light filtering material layer above the transparent base:

forming source through holes and drain through holes in the transparent light filtering material layer; and forming a pattern including sources and initial drains above the transparent light filtering material layer, the sources and initial drains are connected with corresponding active layers through the source through holes and the drain through holes, respectively, wherein the step of forming the pattern including the second light shielding part and the step of forming the pattern including the sources and the initial drains are performed simultaneously.

Preferably, the active layers are made of an oxide material.

Preferably, the transparent light filtering material layer is made of silicon oxide or aluminium oxide.

Preferably, the manufacturing method further comprises the following steps performed after the step of forming the pattern including the sources and the initial drains:

forming a passivation layer above the pattern including the sources and the initial drains;

forming a photoresist layer above the passivation layer;

exposing and developing the photoresist layer so as to form first grooves in the photoresist layer, a position of the first groove corresponds to that of a corresponding first light shielding part;

etching the passivation layer so as to form second grooves aligning with the first grooves;

etching the initial drains to form the light transmitting holes, a boundary of the light transmitting hole exceeds a boundary of a corresponding second groove, and a gap between the boundary of the light transmitting hole and the boundary of the corresponding second groove is the light transmitting gap;

etching the transparent light filtering material layer to obtain the light filtering grooves, each light filtering groove is aligned with the first groove and the second groove;

forming a first shielding material layer by depositing, the first shielding material falling within the light filtering groove forms the first light shielding part;

removing the remained photoresist layer and the first shielding material layer above the photoresist layer.

Preferably, the manufacturing method further comprises a step of:

forming a pattern including a plurality of pixel electrodes above the passivation layer.

Preferably, the manufacturing method further comprises a following step performed between the step of forming the first light shielding part and the step of forming the pattern including the plurality of pixel electrodes:

forming a planarization layer above the passivation layer, wherein the through holes connecting the pixel electrodes with the corresponding drains penetrate through the planarization layer and the passivation layer.

As yet another aspect of the present invention, there is provided a display device comprising the above array substrate.

When the display device including the array substrate provided by the present invention displays, emergent light can have a predetermined wavelength, and the transparent light transmitting space above the first light shielding part forms a resonant cavity, light emerged from the light transmitting gap enters into the light transmitting space to generate a microcavity effect, thus the brightness is increased. Therefore, when the display device including the array substrate performs color display, the brightness of light cannot be decreased, facilitating to reduce the energy consumption.

BRIEF DESCRIPTION OF THE DRAWINGS

The accompanying drawings are used to provide a further understanding of the invention, constitute a part of the specification, are used to interpret the invention in conjunction with the following embodiments, and do not limit the invention. In the drawings.

DETAILED DESCRIPTION OF THE EMBODIMENTS

Embodiments of the invention will be described in detail below in conjunction with the accompanying drawings. It should be understood that, the embodiments described herein are only used to illustrate and interpret the invention, and do not limit the invention.

It should be noted that, the orientation terms "above" and "below" herein refer to the directions "upper" and "down" in FIG. 1.

Figure 1:
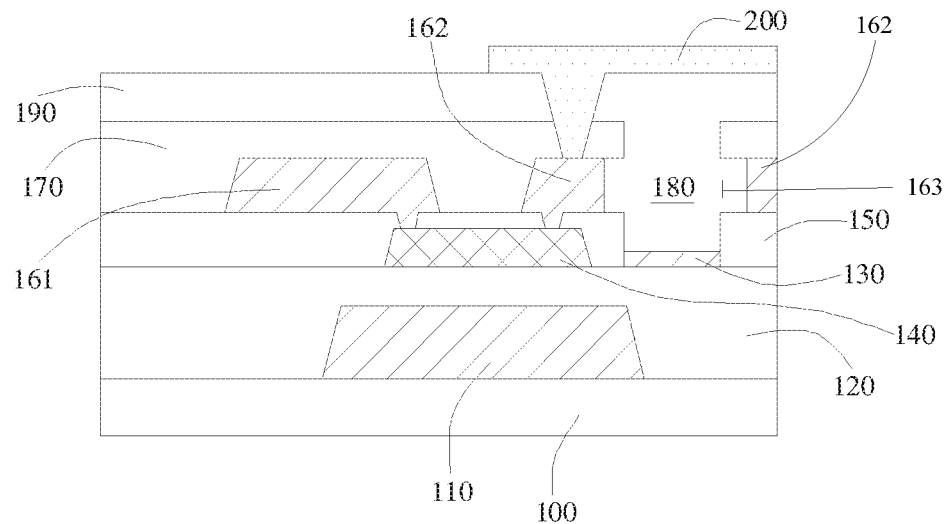
FIG. 1 is a diagram of an array substrate provided by the present invention; and FIG. 2a to FIG. 2i illustrates a flowchart of a manufacturing method of the array substrate provided by the present invention.

As an aspect of the present invention, as shown in FIG. 1, there is provided an array substrate, the array substrate is divided into a plurality of pixel units, wherein each pixel unit is provided therein with a light filtering structure, the light filtering structure includes a first light shielding part 130 and a second light shielding part, which are provided in a thickness direction of the array substrate and spaced apart, the first light shielding part 130 is provided below the second light shielding part, the second light shielding part includes a second light shielding part body 162 and a light transmitting hole 163 penetrating through the second light shielding part body 162 along a thickness direction of the second light shielding part body 162, the first light shielding part 130 is provided below the light transmitting hole 163, a light transmitting gap exists between an inner boundary of an orthographic projection of the second light shielding part body 162 on a layer in which the first light shielding part 130 is provided and a boundary of the first light shielding part 130, a transparent light transmitting space 180 is formed above the first light shielding part 130, and the light transmitting gap allows light with a predetermined wavelength to transmit therethrough.

It can be seen from grating equation d sin α±sin β)=mλ, that, for a same spectrum level m, lights, which are transmitted onto the grating at a same incident angle α and have different wavelengths, form a mixed light, interferences generated by the different wavelengths are located at positions having different angles, that is, diffraction lights with different wavelengths are emitted at different diffraction angles. That is to say, for a specified gating, spectral lines for different wavelengths constituting a gating spectrum in a same level are not coincided with each other, but arranged in turn according to the order of wavelengths, thus a series of separated spectral lines are formed. Therefore, lights with different wavelengths, which are incident in a mixed manner as a mixed light, are separated after the grating diffraction.

In the array substrate provided by the present invention, the light transmitting gap between the inner boundary of the second light shielding part body 162 and the boundary of the first light shielding part 130 is the grating, therefore, diffraction light transmitting through the light transmitting gap may be emerged at a predetermined emergence angle by setting a width of the light transmitting gap, thus the emergent light has a predetermined wavelength (that is, a predetermined color).

When a display device comprising the array substrate provided by the present invention displays, the emergent light may have a predetermined wavelength, and the transparent light transmitting space 180 above the first light shielding part 130 forms a resonant cavity, the emergent light from the light transmitting gap enters into the transparent light transmitting space 180 to generate a microcavity effect, the brightness is increased. Therefore, when color display is realized by using the display device comprising the array substrate described herein, the brightness will not be decreased, facilitating to reduce the energy consumption.

In order to realize display with different colors, preferably, the array substrate comprises a plurality of pixel unit groups, each of which includes three pixel units, light transmitting gaps of the three pixel units of each pixel unit group are different from each other. Specifically, in a pixel unit group, the light transmitting gaps of the three pixel units are set so that lights emerged from the light transmitting gaps of the three pixel units are red light, green light and blue light respectively.

As a preferable embodiment of the present invention, in order to facilitate the manufacture, preferably, the light filtering structure may include a transparent light filtering layer 150 formed with a light filtering groove, the first light shielding part 130 is provided in the light filtering groove and at bottom thereof, the second light shielding part body 162 is provided on an upper surface of the transparent light filtering layer 150, and at least one portion of the light transmitting space 180 is provided in the light filtering groove.

During manufacturing the light transmitting structure including the transparent light filtering layer 150 and the light filtering groove, a removing method may be used. The removing method will be described in detail hereinafter and will not be described here.

In order to realize display, the pixel unit is provided therein with a thin film transistor. In the preferable embodiment shown in FIG. 1, the second light shielding part body 162 and a source 161 and a drain of the thin film transistor are provide in a same layer and are made of a same material, thus simplifying the manufacturing process of the array substrate and decreasing the number of masks used in manufacturing the array substrate.

Further preferably, a portion of the second light shielding part body 162 is integrated with the drain of the thin film transistor, therefore, a structure of the mask for forming the source 161, the drain and the second light shielding part body 162 can be simplified.

In the specific embodiment shown in FIG. 1, the thin film transistor is of a bottom-gate structure. Certainly, the present invention is not limited thereto, the thin film transistor may also be of a top-gate structure.

As a preferable embodiment, an active layer 140 of the thin film transistor is made of an oxide material, and the transparent light filtering layer 150 is provided between the active layer 140 of the thin film transistor and a layer in which the source 161 is provided. As shown in the figures, the source 161 and the drain are connected with the active layer 140 via through holes penetrating through the transparent light filtering layer 150, respectively. In the present invention, the transparent light filtering layer 150 may also be used as an etching stop layer for preventing the active layer 140 from being damaged during formations of the source and the drain. As a preferable embodiment of the present invention, the active layer 140 may be made of IGZO.

In the present invention, there is no specific limitation on the material of the transparent light filtering layer 150, as long as light can transmit therethrough. As a preferable embodiment of the present invention, the transparent light filtering layer 150 is made of silicon oxide and/or aluminium oxide.

Preferably, the array substrate further comprises a passivation layer 170 and a pixel electrode 200, the passivation layer 170 is provided above the layer in which the source 162 and the drain are provided, the pixel electrodes 200 is formed above the passivation layer 170 and electrically connected with a corresponding drain via a through hole.

In the present invention, the pixel electrode 200 may be directly provided on the passivation layer 170. As shown in FIG. 1, a planarization layer 190 may further be provided above the passivation layer 170, and then the pixel electrode 200 is provided on the planarization layer 190, the through hole connecting the pixel electrode 200 and the corresponding drain penetrates through the planarization layer 190 and the passivation layer 170.

In the present invention, there is no specific limitation on the thickness of the passivation layer 170, and preferably, the passivation layer 170 has a thickness ranging from 200 nm to 400 nm.

As a preferable embodiment of the present invention, the transparent light filtering layer 150 has a thickness ranging from 40 nm to 120 nm.

As a preferable embodiment of the present invention, the first light shielding part 130 is made of a metal material.

As another aspect of the present invention, there is provided a manufacturing method of above array substrate, and the manufacturing method comprises steps of:

providing a base substrate, wherein the base substrate is divided into a plurality of pixel units;

forming a pattern including a plurality of first light shielding parts 130 on the base substrate, each pixel unit is provide therein with a first light shielding part 130; and forming a pattern including a plurality of second light shielding part bodies 162, each pixel unit is provide therein with a second light shielding part body 162, in a same pixel unit, the first light shielding part 130 and the second light shielding part body 162 are provided in a thickness direction of the array substrate and spaced apart, a light transmitting gap exists between an inner boundary of an orthographic projection of the second light shielding part body 162 on a layer in which the first light shielding part 130 is provided and a boundary of the first light shielding part 130, a transparent light transmitting space 180 is formed above the first light shielding part 130, and the light transmitting gap allows light with a predetermined wavelength to transmit therethrough.

It should be understood that, the base substrate is a portion of the array substrate.

As described above, the first light shielding part 130, the second light shielding part and the transparent light transmitting space form the light filtering structure in the array substrate. The light transmitting gap allows light with a predetermined wavelength to transmit therethrough, so that the display device comprising the array substrate described herein can perform color display.

In the present invention, there is no specific limitation on order of the step of forming the pattern including the plurality of first light shielding parts and the step of forming the pattern including the plurality of second light shielding parts, as long as the light filtering structure can be obtained.

For example, the first light shielding parts may be formed on the base substrate first, then a transparent spacing layer is formed, and then the second light shielding parts are formed on the transparent spacing layer.

A preferable embodiment of the present invention discloses an implementation in which the second light shielding parts are formed prior to the formation of the first light shielding parts, which will be described in detail later and will not be described here.

In the present invention, there is no specific limitation on the specific structure of the base substrate, as long as an entire array substrate can be obtained, the step of providing the base substrate comprises steps of:

providing a transparent base 100;

forming a transparent light filtering material layer above the transparent base 100;

forming a plurality of light filtering grooves from the transparent light filtering material layer to obtain the transparent light filtering layer 150, wherein each first light shielding part 130 is provided in a corresponding light filtering groove and at bottom thereof, and the second light shielding part body 162 is provided on an upper surface of the transparent light filtering layer 150.

As described above, the transparent light filtering material layer may be made of silicon oxide and/or aluminium oxide. Specifically, the transparent light filtering material layer may be made by using PECVD method. The light filtering grooves may be formed from the transparent light filtering material layer by using a dry etching method so as to obtain the transparent light filtering layer 150.

In the step of providing the transparent base 100, the transparent base 100 is required to be cleaned so as to remove impurities on a surface of the transparent base.

As a preferable embodiment of the present invention, the step of providing the base substrate further comprises the following steps performed prior to the step of forming the transparent light filtering material layer above the transparent base:

forming a pattern including a plurality of gates 110 on the transparent base 100;

forming a gate insulation layer 120 above the pattern including the plurality of gates 110; and forming a pattern including a plurality of active layers 140 on the gate insulation layer 120;

the step of providing the base substrate further comprises the following steps performed after the step of forming the transparent light filtering material layer above the transparent base:

forming source through holes and drain through holes in the transparent light filtering material layer, so that the active layers are exposed by the source through holes and the drain through holes; and forming a pattern including sources 161 and initial drains above the transparent light filtering material layer, the sources 161 and initial drains are connected with corresponding active layers 140 through the source through holes and the drain through holes, respectively, wherein the step of forming the pattern including the second light shielding part body 162 and the step of forming the pattern including the sources and the initial drains are performed simultaneously.

In the present invention, the initial drain may be a drain itself, and may also be a structure formed before the drain is formed.

The pattern including the sources and the initial drains may be made of any one of Mo, MoW and AlNd. The pattern including the sources, the initial drains and the first light shielding parts may be formed by using a sputtering method.

In the present invention, there is no specific limitation on the step of forming the pattern including the gates 110. For example, the pattern including the gates 110 may be formed by using a conventional photolithography patterning process. Specifically, the step of forming the pattern including the gates 110 may comprise:

forming a metal material layer on the transparent base 100 by using a sputtering method or an evaporation method;

forming a photoresist on the metal material layer;

exposing and developing the photoresist; and etching the metal material layer by using a wet etching or a dry etching method, so as to obtain the pattern including the gates 110.

In the present invention, there is no specific limitation on the specific material of the gates 110, for example, the gates 110 may be made of aluminium. In the present invention, there is no specific limitation on the thickness of the gate 110, for facilitating molding, preferably, the gate may have a thickness of 220 nm.

In the present invention, the gate insulation layer 120 may be made of silicon dioxide. As a specific embodiment, the gate insulation layer 120 may be obtained by using a CVD method. In the present invention, the gate insulation layer 120 may have a thickness ranging from 200 nm to 500 nm.

The sources 161, the drains and the second light shielding part bodies 162 may be obtained by a same patterning process, and therefore, the manufacturing method provided by the present invention is simple and low in cost.

In order to simplify the structure of the finally obtained array substrate and simplify the structure of mask for forming the pattern including the sources and the initial drains, preferably, the drain in a pixel unit is integrated with the second light shielding part body 162 in the pixel unit.

In the present invention, there is no specific limitation on the specific material of the active layer 110, as a preferable embodiment of the present invention, the active layer 110 may be made of an oxide material. In this case, the transparent light filtering layer 150 may also be used as an etching stop layer. Accordingly, the transparent light filtering material layer may be made of silicon oxide and/or aluminium oxide. As described above, the active layer 110 may be made of IGZO. In the present invention, an IGZO layer may be formed by depositing using a sputtering method, then a patterning process may be performed thereon to obtain the pattern including the active layer 110. The IGZO layer may have a thickness ranging from 10 nm to 80 nm.

Hereinafter, an embodiment in which the first light shielding part 130 is formed after the formation of the second light shielding part body 162 will be described.

Figure 2A:
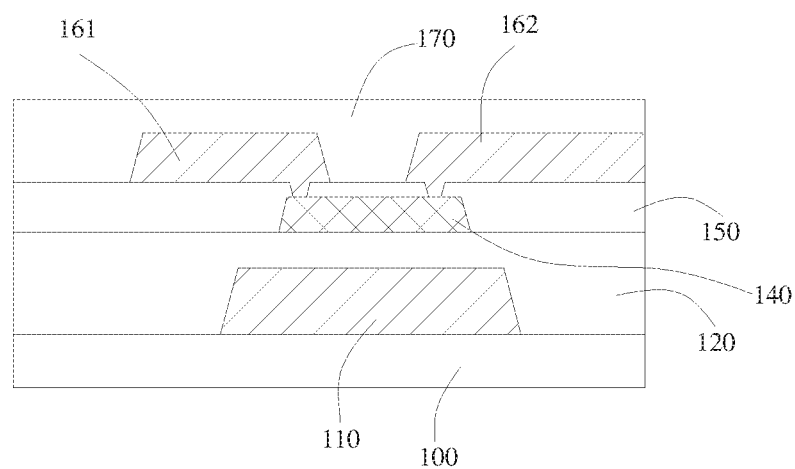
Figure 2B:
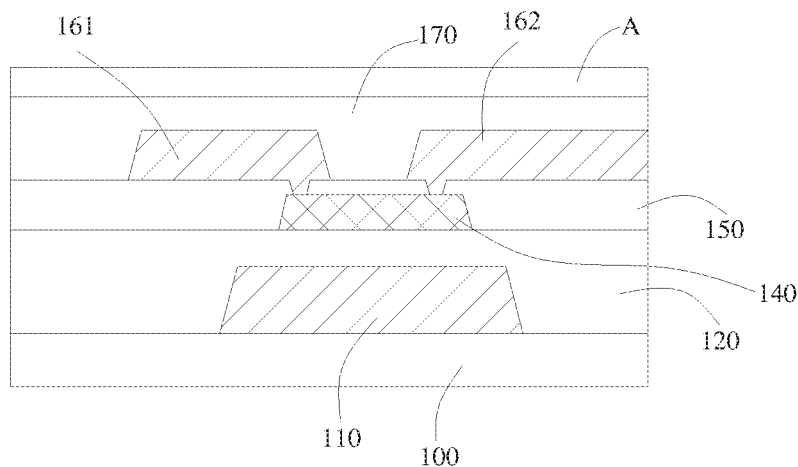
Figure 2C:
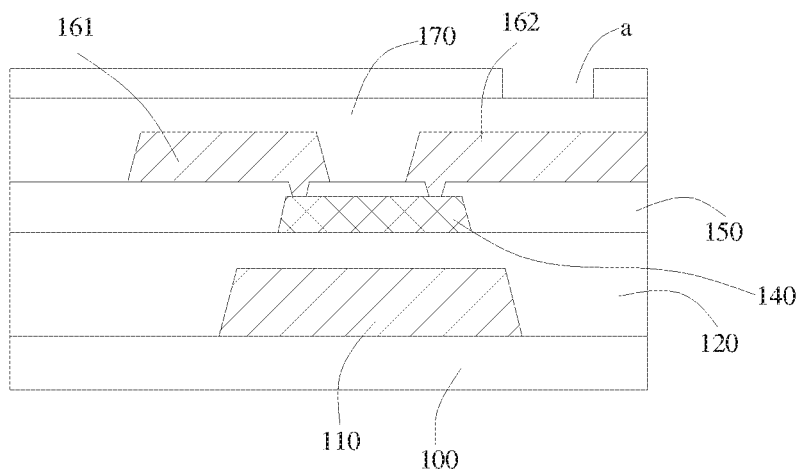
Figure 2D:
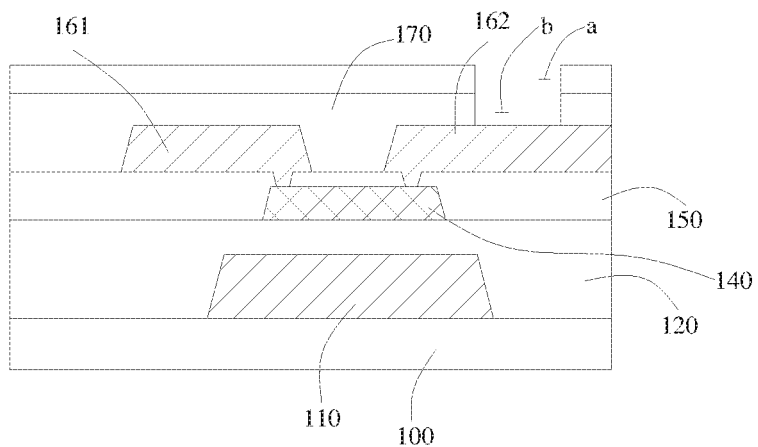
Figure 2E:
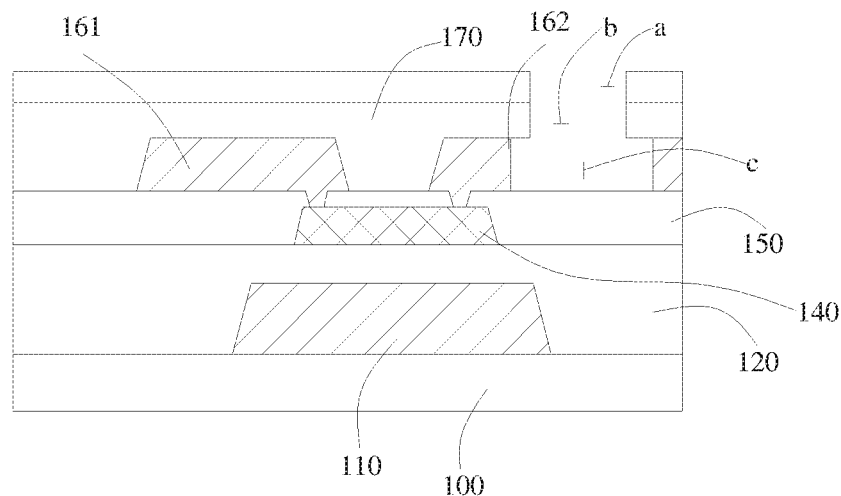
Figure 2F:
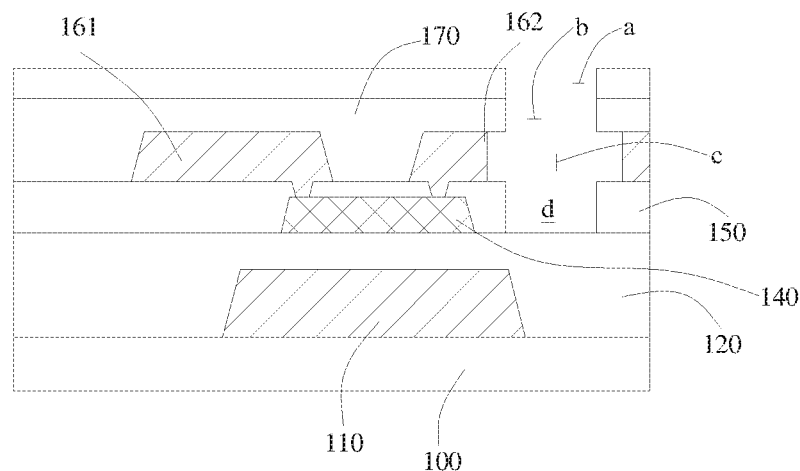
Figure 2G:
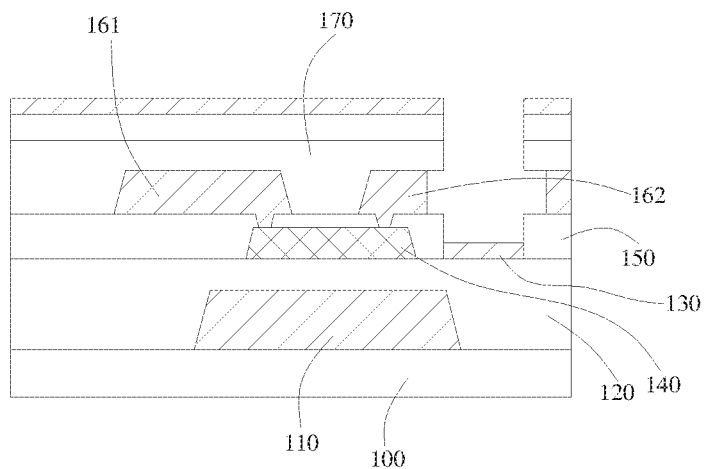
Figure 2H:
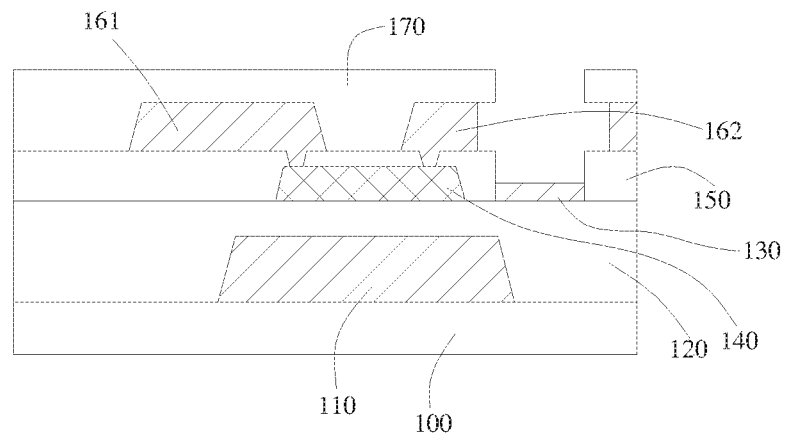

Specifically, the manufacturing method further comprises the following steps performed after the step of forming the pattern including the sources and the initial drains:

forming a passivation layer 170 above the pattern including the sources and the initial drains, as shown in FIG. 2a;

forming a photoresist layer A above the passivation layer 170, as shown in FIG. 2b;

exposing and developing the photoresist layer A so as to form a first groove a in the photoresist layer A, a position of the first groove a corresponds to that of the first light shielding part 130, as shown in FIG. 2c;

etching the passivation layer 170 so as to form a second groove b aligning with the first groove a in the passivation layer 170, as shown in FIG. 2d;

etching the initial drains to form a light transmitting hole c, a boundary of the light transmitting hole c exceeds a boundary of the second groove b, and a gap between the boundary of the light transmitting hole c and the boundary of the second groove b is the light transmitting gap, as shown in FIG. 2e;

etching the transparent light filtering material layer to obtain the light filtering groove d, the light filtering groove d is aligned with the first groove a and the second groove b, as shown in FIG. 2f;

forming a first shielding material layer by depositing, the first shielding material falling within the light filtering groove c forms the first light shielding part 130, as shown in FIG. 2g;

removing the remained photoresist layer and the first shielding material layer above the photoresist layer, as shown in FIG. 2h.

It should be understood that, when removing the remained photoresist layer, the first shielding material layer above the remained photoresist layer is also removed, thus saving an etching process and simplifying the manufacturing method.

As a specific embodiment of the present invention, the passivation layer has a thickness ranging from 200 nm to 400 nm. In the present invention, there is no specific limitation on the specific material of the passivation layer, for example, the passivation layer 170 may be made of silicon oxide or silicon nitride, and specifically, the passivation layer 170 may be formed by using a PECVD method.

Preferably, the manufacturing method comprises: forming a pattern including a plurality of pixel electrodes 200, each pixel unit is provided therein with a pixel electrode 200, which is connected with a corresponding drain via a through hole penetrating through the passivation layer 170.

In the present invention, the pixel electrodes 200 may be directly formed on the passivation layer 170. Generally, The pixel electrode 200 is made of a pixel electrode material with low fluidity (for example, ITO or IZO), In order to ensure the integrity of the pixel electrode 200, preferably, a planarization layer may be provided above the passivation layer 170 first, then a pixel electrode material layer may be formed by sputtering, wherein the pixel electrode material layer has a thickness ranging from 40 nm to 135 nm. After the pixel electrode material layer is formed, the pixel electrodes 200 are formed by a pattering process.

Figure 2I:
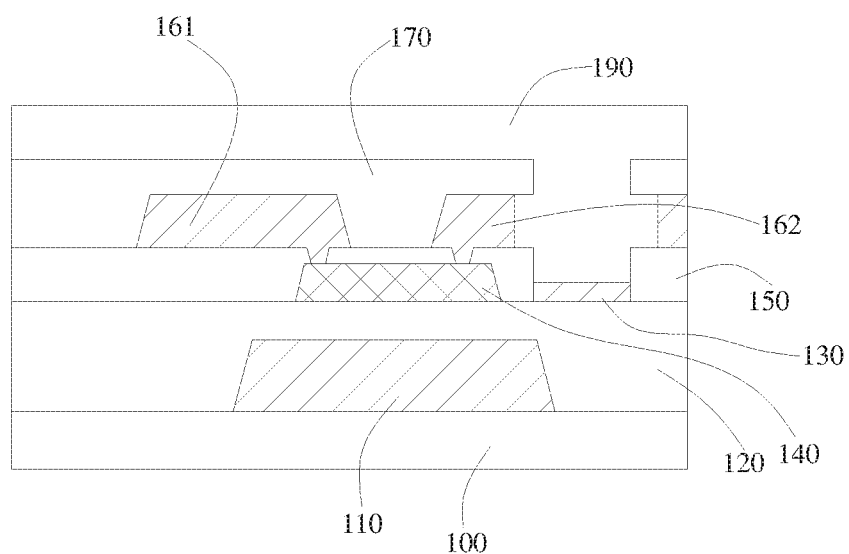

Accordingly, the manufacturing method further comprises a step performed between the step of forming the first light shielding part 130 and the step of forming the pattern including the plurality of pixel electrodes 200:

forming a planarization layer 190 above the passivation layer 170, as shown in FIG. 2i, Accordingly, through holes via which the pixel electrodes 200 are connected with the corresponding drains penetrate through the planarization layer 190 and the passivation layer 170, respectively.

In the present invention, there is no specific limitation on the specific material of the transparent light filtering material layer, for example, the material of the transparent light filtering material layer includes silicon oxide and/or aluminium oxide.

Preferably, the transparent light filtering material layer has a thickness ranging from 40 nm to 120 nm.

As yet another aspect of the present invention, there is provided a display device comprising the array substrate provided by the present invention.

As described above, since the light filtering structure of the array substrate has a light transmitting gap, so that light transmitted through the light transmitting gap has a predetermined wavelength, and the transparent light transmitting space of the light filtering structure generates a microcavity effect, the brightness of the emergent light is increased, and thus it is ensured that the display device can perform color display while lowering the energy consumption.

The display device may be a liquid crystal display device. Specifically, the display device may be an electronic device such as a mobile phone, a tablet computer, a desk computer and a navigator.

It can be understood that the foregoing implementations are merely exemplary implementations used for describing the principle of the present application, but the present application is not limited thereto. Those of ordinary skill in the art may make various variations and improvements without departing from the spirit and essence of the present application, and these variations and improvements shall fall into the protection scope of the present application.

The invention claimed is:

1. An array substrate, which is divided into a plurality of pixel units, wherein each pixel unit is provided therein with a light filtering structure, the light filtering structure includes a first light shielding part and a second light shielding part, which are provided in a thickness direction of the array substrate and spaced apart, the first light shielding part is provided below the second light shielding part, the second light shielding part includes a second light shielding part body and a light transmitting hole penetrating through the second light shielding part body along a thickness direction thereof, the first light shielding part is provided below the light transmitting hole, a light transmitting gap exists between an inner boundary of an orthographic projection of the second light shielding part body on a layer in which the first light shielding part is provided and a boundary of the first light shielding part, a transparent light transmitting space is formed above the first light shielding part, and the light transmitting gap allows one of a red light, a blue light, and a green light to transmit therethrough to perform a color display, wherein the light filtering structure includes a transparent light filtering layer formed with a light filtering groove, the first light shielding part is provided in the light filtering groove and at bottom thereof, the second light shielding part body is provided on an upper surface of the transparent light filtering layer, and at least one portion of the transparent light transmitting space is provided in the light filtering groove, and wherein the pixel unit is provided therein with a thin film transistor, the second light shielding part body and a source and a drain of the thin film transistor are provided in a same layer and are made of a same material.

2. The array substrate of claim 1, wherein the array substrate is divided into a plurality of pixel unit groups, each of which includes three pixel units, light transmitting gaps of the three pixel units of each pixel unit group are arranged so that lights transmitting through the light transmitting gaps are red light, green light and blue light, respectively.

3. The array substrate of claim 1, wherein a portion of the second light shielding part body is integrated with the drain of the thin film transistor.

4. The array substrate of claim 1, wherein the thin film transistor is of a bottom-gate structure, an active layer of the thin film transistor is made of an oxide material, and the transparent light filtering layer is provided between the active layer of the thin film transistor and a layer in which the source is provided.

5. The array substrate of claim 4, wherein the transparent light filtering layer is made of silicon oxide and/or aluminium oxide.

6. The array substrate of claim 1, wherein the array substrate further comprises a passivation layer and pixel electrodes, the passivation layer is provided above the layer in which the source and the drain are provided, and each pixel electrode is provided above the passivation layer and electrically connected with a corresponding drain via a through hole.

7. The array substrate of claim 6, wherein the array substrate further comprises a planarization layer, which is provided above the passivation layer, the pixel electrodes are provided on the planarization layer, and the through hole connecting the pixel electrode and the corresponding drain penetrates through the planarization layer and the passivation layer.

8. The array substrate of claim 1, wherein the transparent light filtering layer has a thickness ranging from 40 nm to 120 nm.

9. The array substrate of claim 1, wherein the first light shielding part is made of a metal material.

10. A display device comprising the array substrate of claim 1.

11. A manufacturing method of an array substrate, wherein the array substrate is divided into a plurality of pixel units, wherein each pixel unit is provided therein with a light filtering structure, the light filtering structure includes a first light shielding part and a second light shielding part, which are provided in a thickness direction of the array substrate and spaced apart, the first light shielding part is provided below the second light shielding part, the second light shielding part includes a second light shielding part body and a light transmitting hole penetrating through the second light shielding part body along a thickness direction thereof, the first light shielding part is provided below the light transmitting hole, a light transmitting gap exists between a inner boundary of an orthographic projection of the second light shielding part body on a layer in which the first light shielding part is provided and a boundary of the first light shielding part, a transparent light transmitting space is formed above the first light shielding part, and the light transmitting gap allows one of a red light, a blue light, and a green light to transmit therethrough to perform a color display, wherein the light filtering structure includes a transparent light filtering layer formed with a light filtering groove, the first light shielding part is providing in the light filtering groove and at bottom thereof, the second light shielding part body is provided on an upper surface of the transparent light filtering layer, and at least one portion of the transparent light transmitting space is provided in the light filtering groove, and wherein the pixel unit is provided therein with a thin film transistor, the second light shielding part body and a source and a drain of the thin film transistor are provided in a same layer and are made of a same material, the manufacturing method comprises the steps of:
providing a base substrate, wherein the base substrate is divided into the plurality of pixel units;
forming a pattern including the plurality of first light shielding parts on the base substrate; and
forming a pattern including the plurality of second light shielding parts.

12. The manufacturing method of claim 11, wherein the step of providing the base substrate comprises steps of:
providing a transparent base;
forming a transparent light filtering material layer above the transparent base;
forming a plurality of light filtering grooves from the transparent light filtering material layer to obtain the transparent light filtering layer, wherein the first light shielding part is provided in a corresponding light filtering groove and at bottom thereof, and the second light shielding part body is provided on an upper surface of the transparent light filtering layer.

13. The manufacturing method of claim 12, wherein the step of providing the base substrate further comprises the following steps performed prior to the step of forming the transparent light filtering material layer above the transparent base:
forming a pattern including a plurality of gates on the transparent base;
forming a gate insulation layer above the pattern including the plurality of gates; and
forming a pattern including a plurality of active layers on the gate insulation layer;
the step of providing the base substrate further comprises the following steps performed after the step of forming the transparent light filtering material layer above the transparent base:
forming source through holes and drain through holes in the transparent light filtering material layer; and
forming a pattern including sources and initial drains above the transparent light filtering material layer, the sources and initial drains are connected with corresponding active layers through the source through holes and the drain through holes, respectively, wherein the step of forming the pattern including the second light shielding part and the step of forming the pattern including the sources and the initial drains are performed simultaneously.

14. The manufacturing method of claim 13, wherein the active layers are made of an oxide material.

15. The manufacturing method of claim 12, wherein the transparent light filtering material layer is made of silicon oxide and/or aluminium oxide.

16. The manufacturing method of claim 13, further comprises the following steps performed after the step of forming the pattern including the sources and the initial drains:
forming a passivation layer above the pattern including the sources and the initial drains;
forming a photoresist layer above the passivation layer;
exposing and developing the photoresist layer so as to form first grooves in the photoresist layer, a position of the first groove corresponds to that of a corresponding first light shielding part;
etching the passivation layer so as to form second grooves aligning with the first grooves;
etching the initial drains to form the light transmitting holes, a boundary of the light transmitting hole exceeds a boundary of a corresponding second groove, and a gap between the boundary of the light transmitting hole and the boundary of the corresponding second groove is the light transmitting gap;
etching the transparent light filtering material layer to obtain the light filtering grooves, each light filtering groove is aligned with the first groove and the second groove;
forming a first shielding material layer by depositing, the first shielding material falling within the light filtering groove forms the first light shielding part;
removing the remained photoresist layer and the first shielding material layer above the photoresist layer.

17. The manufacturing method of claim 16, further comprises a step of:
forming a pattern including a plurality of pixel electrodes above the passivation layer.

18. The manufacturing method of claim 17, further comprises a following step performed between the step of forming the first light shielding part and the step of forming the pattern including the plurality of pixel electrodes:
  forming a planarization layer above the passivation layer, wherein the through holes connecting the pixel electrodes with the corresponding drains penetrate through the planarization layer and the passivation layer.

* * * * *